(12) United States Patent
Tollefsen et al.

(10) Patent No.: US 10,468,576 B2
(45) Date of Patent: Nov. 5, 2019

(54) METHOD OF MANUFACTURING A SEALED THERMOELECTRIC MODULE

(71) Applicant: TEGMA AS, Kristiansand (NO)

(72) Inventors: Torleif A. Tollefsen, Kristiansand (NO); Marianne Aanvik Engvoll, Flekkerøy (NO)

(73) Assignee: TEGMA AS, Kristiansand (NO)

(*) Notice: Subject to any disclaimer, the term of this patent is extended or adjusted under 35 U.S.C. 154(b) by 111 days.

(21) Appl. No.: 15/540,120

(22) PCT Filed: Feb. 10, 2016

(86) PCT No.: PCT/EP2016/052791
§ 371 (c)(1),
(2) Date: Jun. 27, 2017

(87) PCT Pub. No.: WO2016/128442
PCT Pub. Date: Aug. 18, 2016

(65) Prior Publication Data
US 2017/0365765 A1 Dec. 21, 2017

(30) Foreign Application Priority Data
Feb. 13, 2015 (NO) .................................. 20150216

(51) Int. Cl.
*H01L 35/18* (2006.01)
*H01L 35/32* (2006.01)
*H01L 35/34* (2006.01)

(52) U.S. Cl.
CPC .............. *H01L 35/32* (2013.01); *H01L 35/18* (2013.01); *H01L 35/34* (2013.01)

(58) Field of Classification Search
None
See application file for complete search history.

(56) References Cited

U.S. PATENT DOCUMENTS

| | | | |
|---|---|---|---|
| 6,660,926 B2 | 12/2003 | Fleurial et al. | |
| 6,673,996 B2 | 1/2004 | Caillat et al. | |
| 6,759,586 B2 | 7/2004 | Shutoh et al. | |
| 2006/0118159 A1 | 6/2006 | Tsuneoka et al. | |
| 2009/0102003 A1 | 4/2009 | Vogt et al. | |
| 2011/0002493 A1 | 1/2011 | Campbell et al. | |
| 2012/0319303 A1 | 12/2012 | Foster et al. | |
| 2013/0152990 A1 | 6/2013 | Lai et al. | |

(Continued)

FOREIGN PATENT DOCUMENTS

| | | |
|---|---|---|
| EP | 0 609 062 | 8/1994 |
| EP | 1 505 662 | 2/2005 |

(Continued)

OTHER PUBLICATIONS

Office Action dated Feb. 28, 2019 in Chinese Patent Application No. 201680009899.0 with English Translation.

(Continued)

*Primary Examiner* — Tamir Ayad
(74) *Attorney, Agent, or Firm* — Wenderoth, Lind & Ponack, L.L.P.

(57) ABSTRACT

A method for manufacturing a thermoelectric module utilizes solid-liquid interdiffusion bonding for both forming metallization, interconnection and bonding between thermoelectric elements and electric contacts and forming of a hermetic sealing of the thermoelectric module.

10 Claims, 11 Drawing Sheets

(56) References Cited

U.S. PATENT DOCUMENTS

2014/0230875 A1 8/2014 Angermann et al.
2014/0305483 A1 10/2014 Huang et al.

FOREIGN PATENT DOCUMENTS

| EP | 2 242 121 | 10/2010 |
|----|-----------|---------|
| JP | 2004-119833 | 4/2004 |
| JP | 2009-295752 | 12/2009 |
| JP | 2011-216803 | 10/2011 |
| WO | 2011/014479 | 2/2011 |
| WO | 2012/071173 | 5/2012 |

OTHER PUBLICATIONS

International Search Report dated Apr. 12, 2016 in International (PCT) Application No. PCT/EP2016/052791.
Search Report dated Sep. 13, 2015 in Norwegian Application No. 20150216, with English translation.

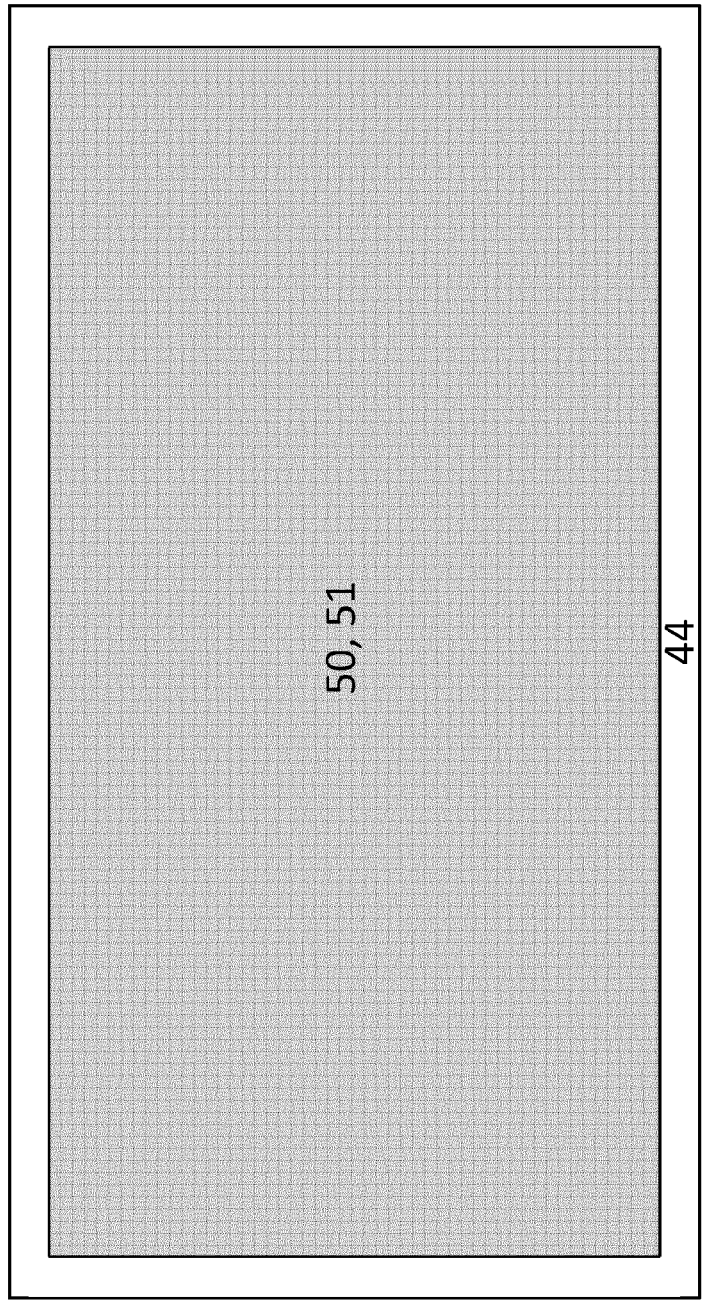

METHOD OF MANUFACTURING A SEALED THERMOELECTRIC MODULE

BACKGROUND

1. Field

The present invention relates to a method for manufacturing a sealed high-temperature thermoelectric module and device formed by the method. The invention relates further to a method of manufacturing a sealed high-temperature thermoelectric module utilizing filled or non-filled $CoSb_3$-based skutterudite as the thermoelectric conversion material.

2. Description of Related Art

The Seebeck effect is one of three possible expressions of the thermoelectric effect, namely the direct conversion of thermal energy to electric energy found in some materials when subject to a temperature gradient creating a heat flux through the material. The Seebeck effect will when connecting the material to a heat sink on one side and a heat source on the opposite side, create an electric potential which may be utilized for driving an electrical device or charging a battery. The thermoelectric conversion efficiency is dependent on the materials Seebeck coefficient and ratio electric over thermal conductivity and is usually defined as the dimensionless figure of merit, ZT:

$$ZT = \frac{\sigma S^2}{\kappa} \cdot T \quad (1)$$

where $\sigma$ is electric conductivity, S is a thermoelectric coefficient often termed the Seebeck-coefficient, $\kappa$ is thermal conductivity, and T is absolute temperature.

Skutterudite is a class of minerals discovered at Skutterud in Norway in 1827, often denoted by the general formula $TPn_3$, where T is a transition metal such as i.e.; Co, Rh, In, Fe, and Pn is one of the pnictogens (member of the nitrogen group in the periodic table); P, As or Sb.

The unit cell of the skutterudite structure contains 32 atoms arranged into the symmetry group Im3 as shown schematically in FIG. 1, which is a facsimile of FIG. 1 of U.S. Pat. No. 6,660,926. The cation in the mineral is the transition metal with an oxidation number of +III. The anion is a radical with oxidation number −IV and consists of four Pn atoms (reference number 120) arranged in a four membered planar ring (reference number 120). The cations (reference number 110) are arranged in a cubic pattern defining a large cube made up of eight smaller cubes, each having a cation at their eight corners. In six of these smaller cubes, there is inserted one anion, and two of the smaller cubes are vacant. Thus, the structure of skutterudite may also be given as: $T_8^{+III}[Pn_4^{-IV}]_6$.

The skutterudite is semiconducting when electric neutral, that is, maintains a ratio of $T:[Pn_4]=4:3$. Further, due to its covalent bonding structure, the skutterudite crystal lattice has a high carrier mobility. At the same time, the complexity of the crystal lattice combined with the heavy atoms results in a relatively low thermal conductivity, so that semiconducting skutterudites often have a favorable electric over thermal conductivity ratio and thus promising figures of merit, ZT.

Semiconducting materials conduct electricity by using two types of charge carriers; electrons and holes (vacant electron sites in the crystal lattice atoms). By doping, i.e. substituting one or more of the T atoms in the crystal lattice with an atom of another element, the semiconducting material can be made to dominantly conduct electric charges by either electrons (n-type conductivity) or holes (p-type conductivity), depending on which dopant (substitute element) being introduced.

An n-type and a p-type semiconductor may be electrically connected to form an electric circuit as schematically illustrated in FIG. 2a). In the figure, an object 100 of n-type semiconducting material is in one end electrically connected to an object 101 of p-type semiconducting material by electric contact 102. At the opposite ends, the objects 100 and 101 are separately connected to one electric conductor 103. The electric conductors 103 may be connected together by an external electric circuit 106, in which, electric current will flow as long as charge carrier couples (separate electrons and holes) are created in the semiconducting materials. In a thermoelectric semiconducting material, charge carrier couples are made when heat flows through the material. Thus, by making the electrodes 103 in thermal contact with a heat reservoir 105 and the opposite electrode 102 in thermal contact with a heat sink 104, a heat flux will flow through the semiconducting materials 100 and 101 in the direction indicated by the arrow, and an electric current will flow from the n-type semiconductor to the p-type semiconductor as long as the external electric circuit 106 is closed.

The configuration shown in FIG. 2 a) constitutes the basic principle of how thermoelectric devices may be constructed. In practice, there will usually be employed several n-type and p-type semiconducting materials electrically connected in series and thermally connected in parallel as shown in i.e. FIG. 2 b), which is a facsimile of FIG. 18 of U.S. Pat. No. 6,660,926.

A thermoelectric device of this kind may provide a compact, highly reliable, long lasting, and noiseless and pollution free manner of generating electric power from a heat source. However, due to the relatively high operations temperatures of several hundred degrees Celsius, the thermoelectric conversion materials and the metallic electric contacts are sensible towards oxidation, such that the thermoelectric module may advantageously be sealed against the atmosphere.

U.S. Pat. No. 6,660,926 discloses that the thermal conductivity of skutterudite can be reduced, and thus obtain a higher figure of merit, by filling the two vacant smaller cubes of the 32-atom unit cell with a binary compound and in addition substituting elements to replace part of the original transition metal and/or pnictogen elements to conserve the valence electron count of the unit cell. The document discloses several examples of such materials having high ZT-values, of which one is $CeFe_{4-x}Co_xSb_{12}$.

From WO 2011/014479 it is known that owing to its large crystal cells, heavy atomic mass, large carrier mobility and disturbance of filled atoms in the Sb-dodecahedron, thermoelectric materials of $CoSb_3$ based skutterudite exhibit superior thermoelectric properties at temperatures in the range from 500 to 850 K. The document discloses that the n-type skutterudite $Yb_yCo_4Sb_{12}$ has a ZT of 1.4 and that p-type skutterudite $Ca_xCe_yCo_{2.5}Fe_{1.5}Sb_{12}$ has a ZT of 1.2. The document discloses further that at 850 K, the vapor pressure of Sb is about 10 Pa, leading to a serious degradation of the semiconductor due to loss of the element Sb. The solution to this problem according to WO 2011/014479 is to coat the skutterudite material with a first metal layer and a second metal oxide layer. The metal layer may be one of; Ta, Nb, Ti, Mo, V, Al, Zr, Ni, NiAl, TiAl, NiCr, or an alloy of two or more of them; and the metal oxide may be one of $TiO_2$, $Ta_2O_5$, $Al_2O_3$, $ZrO_2$, $NiO_2$, $SiO_2$, or a composite of two or more of them, or a multi-layer of two or more of them.

According to U.S. Pat. No. 6,673,996, skutterudite is the only known single thermoelectric material suitable for use over the temperature range from room temperature up to about 700° C. The document describes $CeFe_4Sb_{12}$ based alloys and $CoSb_3$ based alloys as suited materials for p-type and n-type thermoelectric materials, respectively. On the cold side, the thermoelectric materials are connected to a cold shoe made of $Al_2O_3$ coated with a layer of Cu to provide the electric and thermal contact. In order to protect the thermoelectric material from in-diffusion of Cu, there is employed a diffusion barrier of Ni which is formed onto the Cu-layer by electroplating.

Another example of employing $CoSb_3$ based skutterudite as thermoelectric material in a thermoelectric device is shown in U.S. Pat. No. 6,759,586. In this document there is disclosed a thermoelectric device comprising a piece of $CoSb_3$ based skutterudite as either n-type or p-type conductivity attached to an electrode made of a Fe-alloy or an Ag-alloy, and which employs a diffusion barrier between the skutterudite and the electrode made of Sb and one of Au, Ag or Cu.

From WO 2012/071173 it is known a thermoelectric device using skutterudite as the thermoelectric conversion material which is covered with a thin barrier layer deposited by atomic layer deposition. Examples of suited barrier layers include metal oxides such as; $Al_2O_3$, $TiO_2$, $Ta_2O_5$, $SnO_2$, ZnO, $ZrO_2$, and $HfO_2$), and metal nitrides such as; $SiN_x$, TiN, TaN, WN, and NbN).

EP 2 242 121 describes a certain class of filled skutterudite suited for being used as thermoelectric conversion material at temperatures in the range from 20 to 600° C. The group is defined by the general formula: $R_rT_{t-m}M_mX_{x-n}N_n$ ($0 \leq r \leq 1$, $3 \leq t-m \leq 5$, $0 \leq m \leq 0.5$, $10 \leq x \leq 15$, $0 \leq n \leq 2$), where R represents three or more elements selected from the group consisting of rare earth elements, alkali metal elements, alkaline-earth metal elements, group 4 elements, and group 13 elements, T represents at least one element selected from Fe and Co, M represents at least one element selected from the group consisting of Ru, Os, Rh, Ir, Ni, Pd, Pt, Cu, Ag, and Au, X represents at least one element selected from the group consisting of P, As, Sb, and Bi, and N represents at least one element selected from Se and Te. The document discloses further that in order to obtain a good junction between the thermoelectric conversion material end the electrodes of the thermoelectric device, it should be employed a joining layer between these phases comprising an alloy with a composition adjusted to match the thermal expansion coefficient of the thermoelectric conversion material. Examples of suited alloys for use as the joining layer includes titanium alloy of 50 to 100 weight % Ti, and from 0 to 50 weight % of at least one of Al, Ga, In, and Sn. In another example, the joining layer is made of a nickel alloy of 50 to 100 weight % Ni, and from 0 to 50 weight % of Ti. The electrode may be an alloy selected from the group of; titanium alloys, nickel alloys, cobalt alloys, and iron alloys.

Bader et al. 1994 [1] has studied bonding two metals together by use of solid-liquid interdiffusion (SLID) bonding, where a low melting point metal and a high melting point metal are bonded together by forming an intermetallic compound of the two metals at their joint. In one example, the document discloses bonding two pieces of nickel, each having a tin layer on one side, by gently pressing the sides with tin layers against each other and heating the pieces until the tin melts and maintaining the gentle pressure and the temperature until all liquid tin has reacted with the nickel and formed a solid Ni—Sn intermetallic compound which securely bonds the metal pieces together, as illustrated schematically in FIGS. 3 a) to c). From the Ni—Sn phase diagram presented in the document we have that the melting point of Sn is 232° C., while all of the possible intermetallic compounds, $Ni_3Sn$, $Ni_3Sn_2$, and $Ni_3Sn_4$, have a melting point above 800° C.

US 2013/0152990 discloses use of the SLID-technology for bonding electrodes to thermoelectric conversion materials. The document mentions $Bi_2Te_3$, GeTe, PbTe, $CoSb_3$, and $Zn_4Sb_3$ as examples of thermoelectric conversion materials, and the thermoelectric conversion material is first coated with a 1 to 5 μm thick barrier layer of Ni or other suited material, then with a 2-10 μm thick Ag, Ni or Cu layer, and finally with 1-10 μm thick Sn layer. The electrode is on one side first coated with a 2-10 μm thick Ag, Ni or Cu layer, and then with 1-10 μm thick Sn layer. The coated thermoelectric conversion material and the electrode are then laid with their Sn layers side by side and pressed together under a gentle heating until the Sn layers melt and react with the Ag, Ni or Cu to form solid intermetallic compounds bonding the electrode to the thermoelectric conversion material.

US 2009/0102003 discloses method for producing a package including an electrical circuit in a more efficient manner, where the electrical circuits located on a substrate are first tested for their functionality and then the functional circuits are connected by means of a frame enclosing the circuit on the surface of the substrate to a second substrate whose surface area is smaller than that of the first substrate. The substrates are connected, by means of a second frame, which is adapted to the first frame and is located on the surface of the second substrate, such that the first and second frames lie one on top of the other. The bonding may be obtained by SLID-bonding.

US 2011/002493 discloses systems and methods for forming an encapsulated device which include a hermetic seal which seals an insulating environment between two substrates, one of which supports the device. The hermetic seal is formed by an alloy of two metal layers, one deposited on a first substrate and the other deposited on the second substrate. At least one of the substrates may include a raised feature formed under at least one of the metal layers. One of the metal layers may have a diffusion barrier layer and a "keeper" layer formed thereover, wherein the keeper layers keeps the metal confined to a particular area. By using such a "keeper" layer, the substrate components may be heated to clean their surfaces, without activating or spending the bonding mechanism.

EP 0 609 062 discloses a method for the sealing and electrical testing of electronic devices; and particularly for surface acoustic wave devices. In accordance with the present invention, the cost and size of making hermetically sealed packages for electronic devices and of electrically testing each device is significantly reduced over the prior art by making use of mass simultaneous sealing and electrical connection at the wafer level, and by using substrates with hermetically sealed and electrically conductive via holes. Further, cost reduction is effected by making use of final electrical testing with wafer probe test techniques before dicing.

SUMMARY OF THE INVENTION

The main objective of the present invention is to provide a simple and cost-effective manufacturing method of a hermetically sealed thermoelectric module.

A further objective is to provide thermoelectric modules made by the method, and in particular thermoelectric modules utilizing filled and non-filled $CoSb_3$-based skutterudite thermoelectric conversion materials.

The invention is based on the realization that a cost-effective and simple manufacturing of hermetically sealed thermoelectric modules may be obtained by utilizing a method of forming a resilient interconnection, bonding of semiconducting thermoelectric materials to the electrodes of thermoelectric devices described in co-pending patent application NO 20141357, which is hereby incorporated by reference in its entirety, for forming both the electrical contact, thermal element interconnects and the sealing of the thermoelectric module.

A suitable method for manufacturing a thermoelectric module of the invention is characterized in that the method comprises:

1) pre-processing a first and second electrically nonconductive cover substrate, each having a first and second surface, for electrical connection and sealing by:
   i) attaching a stratified layered metallic electric contact element consisting of a third bonding layer of metal A and an optional fourth bonding layer of metal B onto each location of the first side of the first and the second cover substrate where an electric contact with a thermal element is to be formed, the electric contact element is attached with its third bonding layer facing the first side of the respective cover substrate, and
   ii) attaching an equally dimensioned stratified layered metallic sealing frame consisting of a seventh bonding layer of a metal C and an optional eighth bonding layer of metal D along the periphery of the first side of both the first and the second cover substrate such that the seventh bonding layer of each metal frame is facing the first side of the respective cover substrate, 2) preparing the formation of the electrical connections between the electrical contact elements and a number of p-doped and a number of n-doped thermoelectric elements, where each p-doped and n-doped thermoelectric element has on a first side and on a second side opposite the first side, a first bonding layer of the metal A and a second bonding layer of the metal B directly onto the first bonding layer, by:
   j) selecting one of either the first or the second cover substrate:
   jj) placing a p-doped thermoelectric element with its second bonding layer on its first side facing either the third or the optional fourth bonding layer of the respective electric contact element on each location where an electrical connection between the p-doped thermoelectric element and the electric contact element is to be formed on the selected cover substrate, and
   jjj) placing a n-doped thermoelectric element with its second bonding layer on its first side facing either the third or the optional fourth bonding layer of the respective electric contact element on each location where an electrical connection between the n-doped thermoelectric element and the electric contact element is to be formed on the selected cover substrate, 3) preparing a hermetically sealing of the thermoelectric module by:
   k) placing a sealing element having on a first side and on a second side opposite the first side a fifth bonding layer of a metal C and a sixth bonding layer of a metal D, with its sixth bonding layer facing either the seventh or the optional eighth bonding layer of the sealing frame of the selected cover substrate, and 4) forming both the electrical contacts and the hermetically sealing of the thermoelectric module by:
   l) placing the non-selected cover substrate such that either the seventh or the optional eighth bonding layer of its sealing frame and either the third or the optional fourth bonding layer of its attached electric contact elements faces and obtains physical contact with the respective sixth bonding layer of the second side of the sealing element and second bonding layer of the respective p-doped and n-doped thermoelectric element placed onto the selected cover substrate, and
   ll) applying a gentle pressure pressing the first and second cover substrate against each other and annealing to a temperature at which the metal A and metal B and the metal C and D bonds all bonding layers in contact with each other together by solid-liquid interdiffusion, and
   wherein the melting point of metal A is higher than metal B and the melting point of metal C is higher than metal D, and the metals A and B and metals C and D are chemically reactive towards each other and forms one or more intermetallic compounds by solid-liquid interdiffusion when subject to heating above the melting point of metals B and D.

An advantageous feature of the invention of NO 20141357 is the employment of the solid-liquid interdiffusion bonding concept in combination with use of an adhesion layer/diffusion barrier layer/adhesion layer structure (interchangeably also termed as; the ADA-structure) in-between the solid-liquid interdiffusion bonding layers and the thermoelectric element. This provides a strong and resilient mechanical bonding between the electric contact elements and thermoelectric elements, and is especially suited for use in high-temperature thermoelectric modules which for some embodiments may be heated up to 700-800° C. By employing the same ADA-structure and the solid-liquid interdiffusion bonding concept for forming the sealing of the unit, it is obtained a similar strong and resilient bonding and at the same time gas tight sealing of the device unit. Another advantage is that the formation of both the electric contacts with the thermoelectric elements and the hermetically sealing of the thermoelectric module may be performed in a single manufacturing process step.

Thus, the invention may advantageously also include formation of an adhesion layer/diffusion barrier layer/adhesion layer structure directly onto both the first and second side of the thermoelectric elements before formation of the first bonding layer of metal A and the second bonding layer of metal B. That, is the suitable method also comprises a pre-processing of the thermoelectric elements, which comprises the following process steps:

placing the at number of p-doped and n-doped thermoelectric elements into a deposition chamber, and then:
   i) depositing a first adhesion layer of a first metal directly onto the first and the second surface of the thermoelectric elements,
   ii) depositing a diffusion barrier layer of a non-metallic compound of a second metal directly onto the first adhesion layer on the first and second surface of the thermoelectric elements,
   iii) depositing a second adhesion layer of a third metal directly onto the diffusion barrier layer of the non-metallic compound of the second metal on the first and second surface of the thermoelectric elements, wherein the deposition chamber is either a chemical vapor deposition chamber, a physical vapor deposition chamber, or an atomic deposition chamber, and the deposition of the different layers of steps i) to iii) is obtained by feeding pre-cursor gases with varying chemical composition into the deposition chamber, the non-metallic compound of the second metal is either a nitride or an oxide of the second metal, and wherein the deposition chamber is either a chemical vapor deposition chamber, a physical deposition chamber, or an atomic deposition chamber, and the deposition of the different layers of steps i) to iii) is obtained by feeding pre-cursor gases with varying chemical composition into the deposition chamber.

The deposition of the first bonding layer of a metal A onto the second adhesion layer on the first and second surface of the thermoelectric elements, and the deposition of the second bonding layer of a metal B directly onto the first bonding layer the on the first and second surface of the thermoelectric elements, may advantageously be obtained by electroless plating or electroplating. Alternatively, the first and second bonding layer may be deposited by chemical vapor deposition in the same chamber as applied for depositing the ADA-structure.

Similarly, the suitable method may advantageously also include formation of an adhesion layer/diffusion barrier layer/adhesion layer structure directly onto both the first and second side of the sealing element before formation of the fifth bonding layer of metal C and the sixth bonding layer of metal D. That, is the method also comprises a pre-processing of the sealing element, which comprises the following process steps:

placing the sealing element into a deposition chamber, and then:

a) depositing a first adhesion layer of a first metal directly onto the first and the second surface of the sealing element, aa) depositing a diffusion barrier layer of a non-metallic compound of a second metal directly onto the first adhesion layer on the first and second surface of the sealing element, aaa) depositing a second adhesion layer of a third metal directly onto the diffusion barrier layer of the non-metallic compound of the second metal on the first and second surface of the sealing element, wherein
the deposition chamber is either a chemical vapor deposition chamber, a physical vapor deposition chamber, or an atomic deposition chamber, and the deposition of the different layers of steps i) to iii) is obtained by feeding pre-cursor gases with varying chemical composition into the deposition chamber,
the non-metallic compound of the second metal is either a nitride or an oxide of the second metal, and wherein the deposition chamber is either a chemical vapor deposition chamber, a physical deposition chamber, or an atomic deposition chamber, and the deposition of the different layers of steps a) to aaa) is obtained by feeding pre-cursor gases with varying chemical composition into the deposition chamber.

Alternatively, the sealing element may be provided by a single adhesion layer followed by a fifth and sixth bonding layer. In this embodiment, the deposition of single adhesion layer may advantageously be obtained by depositing a Cu-paste followed by an annealing at a temperature in the range from 600 to 700° C., before depositing the fifth bonding layer of a metal C onto the adhesion layer by electroless plating or electroplating of metal C, and then depositing the sixth bonding layer of a metal D directly onto the fifth bonding layer by electroless plating or electroplating of metal D. This is applied on both the first and second side of the sealing element.

The pre-processing of the first and second electrically nonconductive cover substrates may advantageously be obtained by depositing a patterned layer of a metal paste onto the first side of the cover substrates, pressing the third bonding layer of each electric contact element that is to be attached to the cover substrates against the deposited metal paste and then annealing at a temperature which sinters the metal paste with the cover substrates and the metal of the third bonding layer of the electric contact elements. Similarly, the attachment of the sealing frame may be obtained by including the peripheral region of the cover substrates when depositing the patterned layer of metal paste followed by pressing the seventh bonding layer of the sealing frame against the deposited metal paste and then annealing at a temperature which sinters the metal paste with the cover substrate and the metal of the seventh bonding layer of the sealing frame.

The term "electrically nonconductive" as used herein means that the material has an electric conductivity of less than $10^{-5}$ mho/m, and preferably an electric conductivity typical for dielectric materials of less than $10^{-7}$ mho per/m.

In a second aspect, the present invention relates to a thermoelectric module, comprising:

a number of thermoelectric elements of semiconducting thermoelectric conversion material doped to n-type conductivity and a number of thermoelectric elements of semiconducting thermoelectric conversion material doped to p-type conductivity, a number electric contact elements comprising a third bonding layer of a metal A, and optionally, a fourth bonding layer of a metal B deposited directly onto the third bonding layer, a sealing system comprising a first sealing frame, a sealing element, and a second sealing frame, the first and second sealing frame comprises a seventh bonding layer of a metal C, and optionally, an eighth bonding layer of a metal D deposited directly onto the seventh bonding layer and a first cover substrate in thermal contact with a heat reservoir and second cover substrate in thermal contact with a heat sink, where the thermoelectric elements of n-type conductivity and the thermoelectric elements of p-type conductivity are electrically connected in series by the electric contact elements, each electric contact element is on a first side bonded to at least one thermoelectric element, and on a second side opposite the first side bonded to one of the first and second cover substrate, characterized in that each thermoelectric element of n-type conductivity and each thermoelectric element of p-type conductivity has on both its first and second surface:

i) a first adhesion layer of a first metal deposited directly onto the first and second surfaces, ii) a diffusion barrier layer of a non-metallic compound of a second metal deposited directly onto the first adhesion layer on the first and second surfaces, iii) a second adhesion layer of a third metal deposited directly onto the diffusion barrier layer of the non-metallic compound of the second metal on the first and second surfaces, iv) a first bonding layer of a metal A deposited directly onto the second adhesion layer on the first and second surfaces, and v) a second bonding layer of a metal B deposited directly onto the first bonding layer the on the first and second surfaces, and the sealing element has on a first side and a second side opposite the first side:

vi) a fifth bonding layer of a metal C deposited directly onto the second adhesion layer on the first and second sides, and a sixth bonding layer of a metal D deposited on the fifth bonding layer, the first sealing frame is at a first side of the first bonding layer attached to the first cover substrate and on the side opposite of the first side bonded to the sealing element by solid-liquid interdiffusion bonding, and the second sealing frame is at a first side of the seventh bonding layer attached to the second cover substrate and on the side opposite the first side bonded to the sealing element by solid-liquid interdiffusion bonding, and where the non-metallic compound of the second metal is either a nitride or an oxide of the second metal, the melting point of metal A is higher than metal B and metal B is chemically reactive towards metal A at their common interface when subject to heating above the melting point of metal B, and the solid-liquid interdiffusion bonds are formed by laying the second bonding layer of metal B of the thermoelectric elements and the third bonding layer of metal A of the electric contact elements, or optionally a fourth bonding layer of metal B of the electric contact elements, respectively, facing and contacting each other followed by an annealing which causes metal B of the second bonding layer to melt and reacting with metal A of the first bonding layer of the thermoelectric elements and with the metal A of the third bonding layer of the electric contact elements, and the solid-liquid interdiffusion bonds between the sealing element and the sealing frame are formed by laying the sixth bonding layer of metal D of the sealing element facing and contacting the seventh bonding layer of metal C of the sealing frame followed by an annealing which causes metal D of the sixth bonding layer to melt and react with metal C of the fifth bonding layer of the sealing element and with the metal C of the seventh bonding layer of the sealing frame.

In one embodiment of the second aspect of the invention, the sealing element may advantageously further an ADA-structure with an optional first adhesion layer. I.e. the thermoelectric module may further comprise:

an optional first adhesion layer of a first metal deposited directly onto the first and second sides, a diffusion barrier layer of a non-metallic compound of a second metal deposited directly onto the first adhesion layer on the first and second sides, and a second adhesion layer of a third metal deposited directly onto the diffusion barrier layer of the non-metallic compound of the second metal on the first and second sides.

The term "metal" as used in the first and second aspect of the invention is to be interpreted as metal in the generic sense of the term such that it encompasses elementary metal as well as alloys of the same metal. Thus, for example, if the metal in one example embodiment is Ni, the term may be interpreted to be elementary Ni or a Ni-alloy such as i.e. nickel vanadium alloy, nickel silver alloy or other nickel alloys.

The term "non-metallic compound of a metal" as used herein means a chemical compound of that metal, such as i.e. a metal nitride, metal oxide, or other chemical compound of that specific metal which does not exhibit chemical or physical properties of a typical metal. Intermetallic compounds involving this specific metal are thus not included in this term.

The term "thermoelectric element (interchangeably also termed as: TE-element)" as used herein, means any lump, piece or other form of a compact mass of a solid semiconducting material exhibiting satisfactory ZT-values for being used in thermoelectric modules when doped to p-type or n-type conductivity. The TE-element has two opposed surfaces, a first surface and a second surface, which advantageously may be substantially planar and parallel on two opposed sides of the TE-element to alleviate use of the SLID-bonding for interconnection of two or more TE-elements into a TE-module having the structures as illustrated in FIGS. 2 a) and 2 b). However, the feature of substantially parallel and planar opposite surfaces of the TE-element is not mandatory, nor is the terms parallel and planar to be interpreted in the mathematical sense of the terms. It may also be applied TE-elements having slightly inclined surfaces and surfaces with certain degree of irregular surface roughness as long as it is practically feasible to compensate for these "defects" by using a thicker bonding layers when forming the SLID-bonding etc. The term "substantially planar and parallel" is thus to be interpreted in this context. Each TE-element which is to be applied in the first and/or second aspect of the invention may advantageously have substantially the same geometry and dimensions with substantially planar and parallel first and second surfaces where the first adhesion layer is to be deposited. The term "substantially same geometry and dimensions" as used herein means that each TE-element has almost the same design as the other TE-elements applied in the TE-module within a reasonable variation such that the vertical distance between the first and second surface is the same for each TE-element within a few percent variation allowing placing the TE-elements side by side and obtaining a satisfactory SLID-bonding with the electric contact elements to form a TE-module with a similar structure and design as the TE-module illustrated in FIGS. 2 a) and 2 b).

The term "sealing frame" as used herein, is a stratified layered metallic frame dimensioned to form a continuous "fence resembling wall" along the periphery of the electrically nonconductive cover substrate when attached to the cover substrate, as illustrated schematically in FIGS. 3 a) and 3 b). FIG. 3 a) shows a cover substrate, either the first cover substrate 50 or the second cover substrate 51, with a sealing frame attached along its periphery. FIG. 3 b) displays the same structure as seen from above. The stratified layered metallic structure consists of at least a seventh bonding layer of metal C (reference number 43) and at least an eighth bonding layer of metal D (reference number 44), as illustrated in FIGS. 3 a) and 3 b). The metal C of the seventh bonding layer and metal D of the eighth bonding layer may advantageously be of the same metal A and metal B as of the corresponding third and fourth bonding layers of the electric contact elements and the TE-elements in order to alleviate performing the SLID-bonding connecting both the sealing frames to the sealing element and the electric contact elements to the TE-elements simultaneously in one annealing process. In this case metal A=metal C and metal B=metal D. However, it is envisioned that the sealing frame is made of other bonding metal pairs suited for the SLID-bonding technique than the corresponding metal pair employed in the electric contact elements, i.e. that metal A metal C and metal B metal D. Further, it is also envisioned that stratified layered structure of the sealing frame is a sandwich-resembling structure of several intertwined bonding layers of metals C and D.

The term "electric contact element" as used herein, is a stratified layered metallic lump, piece etc. consisting of a at least a third bonding layer of metal A (reference number 31), and at least a fourth bonding layer of metal B (reference number 32) dimensioned to be attached onto the first cover substrate 50 or the second cover substrate 51 where an electric contact electrically connecting one or more TE-elements is to be formed. As for the sealing frame, it is advantageous that the metal A=metal C and metal B=metal D, but it is envisioned that metal A≠metal C and metal B≠metal D, and further that the stratified layered structure of the electric contact element is a sandwich-resembling structure of several intertwined bonding layers of metals A and B. The physical dimensions of the electric contact elements and the number of electric contact elements which need to be attached to the first 51 and second 51 cover substrate, depends both on the number of electric contacts that are to be formed and the physical dimension of the TE-elements that are to be employed in the thermoelectric module, and further on the physical configuration of the assembly of serially connected TE-elements of the module. This needs to be decided for each specific case by the person skilled in the art, but is a task within the ordinary skills of a person skilled in the art and needs no further description here. An example embodiment illustrating the principle of the preparation of the formation of the electrical connections between the electrical contact elements and the number of p-doped and a number of n-doped thermoelectric elements of the thermoelectric module is illustrated schematically in FIGS. 4 *a*) and 4 *b*). In this example embodiment, the thermoelectric module consists of six TE-elements doped to p-type conductivity and six TE-elements doped to n-type conductivity assembled in an interdigitated pattern of 4×3 TE-elements. In order to electrically connecting this pattern of TE-elements, an array of seven electric contacts elements 30 may be laid out and attached with their third bonding layer 31 facing the first cover substrate 50 as illustrated in FIG. 4 *a*). The figure is illustrated from above such that it is only the fourth bonding layer 32 of the contact elements that is visible. On the second cover substrate 51, it is necessary to attach six electric contact elements as shown in FIG. 4 *b*).

Many semiconducting thermoelectric conversion materials may leach elements by solid interdiffusion etc. which are detrimental to the thermal and electric properties of the interconnection electrodes (the electric contact elements), such that it should be employed an intermediate diffusion barrier layer between the TE-element and the electric contact elements to protect the electrodes. Thus, the invention according to the first and second aspect may advantageously comprise a thin layer of a thickness from 100 nm and above of a metal oxide or a metal nitride as a diffusion barrier layer. Examples of preferred diffusion barriers include, but are not limited to 100-1000 nm thick layers of $CrN_x$, $TaN_x$, or $TiN_x$ formed by vapor deposition. The thickness of the diffusion barrier layer may advantageously be in one of the following ranges: from, 50 to 5000 nm, from 75 to 3000 nm, from 100 to 2000 nm, from 150 to 1000 nm, from 150 to 750 nm, from 200 to 500 nm, from 200 to 400 nm or from 200 to 300 nm.

The adherence between the diffusion barrier layer and the semiconducting thermoelectric conversion material has sometimes proven to be insufficient to withstand the shear stresses arising from the thermal expansion involved in thermoelectric devices which may lead to an electrically disconnection between the TED-element and its electrode. It is thus common to increase the adherence between the TED-element and the electrode by applying an intermediate adhesion layer. The invention according to the first and second aspect should thus comprise a first adhesion layer which is deployed directly onto the first and second surface of each TED-element that is to be employed in the TE-module and which forms an intermediate layer between the TE-element and the diffusion barrier layer. Many metals are known to adhere well to both semiconducting materials and typical diffusion barriers and may thus be for being applied as the first adhesion layer. For instance, when the diffusion barrier layer is a metal nitride or metal oxide, any metal known to a person skilled in the art to form excellent bonding with semiconducting materials and metal oxides or metal nitrides may be applied by the first and second aspects of the present invention. The thickness of the first adhesion layer may advantageously be in one of the following ranges; from 20 nm to 2 μm, from 50 nm to 1.5 μm, from 100 nm to 1.5 μm, from 200 nm to 1.5 μm, or from 500 nm to 1.5 μm. The actual choice of which metal to be applied as the first adherence layer is usually dependent upon which materials are being applied in the semiconducting thermoelectric conversion material and in the diffusion barrier layer. However, a person skilled is able to make this selection from her/his general knowledge. Examples of suited metals for use as adhesion layers includes, but is not confined to; Cr, Cu, Sn, Ta, and Ti.

The adherence between the diffusion barrier layer and the first bonding layer of the metal system of the SLID-bonding has also proven to be possibly problematic due to insufficient resilience towards thermally induces shear stresses. It is thus suggested by the present invention according to the first and second aspect to apply a second adherence layer in-between the diffusion barrier layer and the first or the fifth bonding layer. The second adherence layer may as the first adherence layer, be a metal layer but not necessarily of the same metal as the first adherence layer. As far as the inventor knows, the use of a second adherence layer is not known in the prior art. The thickness of the second adhesion layer may be in one of the following ranges; from 20 nm to 1000 nm, from 30 nm to 750 nm, from 40 nm to 500 nm, from 100 nm to 400 nm, or from 150 nm to 300 nm. The actual choice of which metal to be applied as the second adherence layer is usually dependent upon which materials are being applied diffusion barrier layer and in the first or fifth bonding layer. A person skilled is able to make this selection from her/his general knowledge.

However, a substantial simplifying and work load saving in the production process may be obtained by choosing the same metal in both the first and second adhesion layers as the metal of the metal oxide or metal nitride of the diffusion barrier layer. In this case the ADA-structure is made up of one single metal in elementary form and as an oxide or nitride, such that the entire ADA-structure may be deposited in one single vapor deposition process by simply changing the composition of the pre-cursor gases being fed into the deposition chamber. Thus, if the diffusion barrier layer is made of one of the preferred layers of CrN, TaN, or TiN, both the first and second adhesion layers may advantageously be made of elementary Cr, Ta, or Ti, respectively. In this example embodiment, the first metal of the first adhesion layer, the second metal of the diffusion barrier layer and the third metal of the second adhesion layer is the same metal.

An example embodiment of a TE-element provided with the ADA-structure and bonding layers is schematically illustrated in FIG. 5. The figure displays an element made of a semiconducting thermoelectric conversion material 1 having a first surface 10 opposite to a second surface 20 is shown. On both the first 10 and second 20 surfaces there are deposited a first adhesion layer 2 of a first metal, followed by a diffusion barrier layer 3 of a non-metallic compound of a second metal, and then a second adhesion layer 4 of a third metal. All layers are deposited directly onto each other such that they are in direct contact with its respective neighboring layer. The first adhesion layer, the diffusion barrier layer and the second adhesion layer constitute the ADA-structure, as shown with the parenthesis on the figure marked ADA. Then follows the first bonding layer 5 of metal A and the second bonding layer 6 of metal B which are defining the "element part" of the metals system that is to be formed into the SLID-bond. These layers forms together with the ADA-structure the ADA/SLID-structure as shown by the parenthesis marked ADA/SLID on the figure. For the purpose of illustration, the dimensions in the figures are not shown to scale.

The term "sealing element" as used herein means any continuous frame of a solid material dimensioned to close and form a gas tight sealing of the gap between the sealing frame attached to the first cover substrate and the sealing frame attached to the second cover substrate in the assembled thermoelectric module. Advantageously, the sealing frame may have a horizontal cross-sectional area which is congruent with the horizontal cross-sectional area of the first and second sealing frame. The sealing element may be made of any gas impenetrable solid material able to withstand the operating temperatures of the thermoelectric module and which has a thermal conductivity of less than 20 W/mK, preferably less than 10 W/mK, and more preferably less than 1 W/mK, and even more preferably less that 1 W/mK. Advantageously, the material of the sealing element may also be a dielectric in order to prevent any current from leaking across the sealing assembly. Examples of suited materials for use as the sealing frame include, but are not limited to, zirconia ($ZrO_2$), silicon nitride, and aluminum titanate ($Al_2TiO_5$). The sealing element is provided with a fifth bonding layer of metal C and a sixth bonding layer of metal D on a first side and a second side opposite the first side in a similar way as the TE-elements in order to form the gas tight sealing with the sealing frames attached to the first and second cover substrates by SLID-bonding. The adherence between the sealing element and its fifth bonding layer of metal C is subject to similar thermal stresses as the adherence between the TE-element and its first bonding layer of metal A. Thus, the invention according to the invention may advantageously additionally comprise formation of the same or a similar ADA-structure in-between the fifth bonding layer on the sealing element as formed in-between the TE-element and its first bonding layer as described above.

The term "solid-liquid interdiffusion bonding" or "SLID-Bonding" as used herein, is a high temperature technique for interconnection of two metal phases by use of an intermediate metal phase and annealing such as described in i.e. Bader et al. 1994 [1]. The interconnection (bonding) is obtained by employing an intermediate metal phase which in the liquid phase is chemically reactive against the two outer metal phases forming solid intermetallic compounds, and which has a lower melting point than the two metal outer phases that are to be interconnected. SLID-bonding is also denoted as transient liquid phase bonding, isothermal solidification or off-eutectic bonding in the literature. Examples of suited metal systems for SLID-bonding comprise Au—In, Au—Sn, Ag—In, Ag—Sn, Cu—Sn, and Ni—Sn. In principle, any thickness of the layers of the metal system may be applied in a SLID-bonding. This also applies to the method according to the first and second aspect of the invention. However, in practice, it is advantageous that the initial thickness of the bonding layer of metal A and/or C is in one of the following ranges; from 1 μm to 1 cm, from 1 μm to 0.5 cm, from 1 μm to 0.1 cm, from 2 μm to 500 μm, from 2 μm to 100 μm, from 2 μm to 50 μm, or from 3 μm to 10 μm. And the initial thickness of the bonding layer of metal B and/or D may advantageously be in one of the following ranges; from 300 nm to 0.75 cm, 300 nm to 0.3 cm, 300 nm to 750 μm, from 200 nm to 400 μm, from 200 nm to 75 μm, from 200 nm to 30 μm, or from 300 nm to 3 μm. The term "initial thickness" of the bonding layer is the thickness of the respective bonding layer before annealing and formation of the intermetallic compound(s). Both the chemical structure and physical dimensions of the resulting SLID-bond layers are somewhat changed as compared to the initial (non-reacted) bonding layers involved in the SLID-bonding.

The principle of forming a SLID-bonding is illustrated schematically in FIGS. 6 *a*) to *c*). In figure a) there are illustrated two elements of a two-layered metal system consisting of metal A and metal B. The upper element in FIG. 6 *a*) may i.e. be the first and second bonding layer of a TE-element according to the first and second aspect of the invention and the lower element may be the third and fourth bonding layer of an electric contact element, or vice versa. In FIG. 6 *b*) the two elements are contacted such that the bonding layers of metal B of both elements are facing each other. In FIG. 6 *c*), the two elements have been subject to an annealing process which has made the metals to react and form an intermediate solid intermetallic phase A-B which securely and firmly bonds the remaining part of the first bonding layer of both the TE-element and the third or fourth bonding layer of the electric contact element together into one solid object defined by all three layers. It is known to form the SLID-bond by using several alternating metal layers of metals A and B instead of the two-layer metal system discussed above. This alternative embodiment of the SLID-bonding may be applied by the invention according to the first and second aspect if convenient. The metal A in the FIGS. 6 *a*) to *c*) corresponds to the metal of the first bonding layer and the metal B corresponds to the metal of the second bonding layer of either the TE-element or the electric contact element and/or the sealing element and the sealing frame. Metal A has thus the highest melting point and may i.e. be one of; Au, Ag, Cu, Ni or other metals. Metal B is having the lower melting point and may i.e. be one of; In, Sn or other metals. The choice of which metal system to be applied in the SLID-bonding may advantageously take into consideration the thermal expansion of other components in the TE-device, especially the thermal expansion of the TE-element.

In FIG. 7 the principle solution of how to assemble the TE-elements and electric contact elements before the annealing process for forming the SLID-bonds is illustrated by way of two TE-elements 1, one doped to p-type conductivity and the other doped to n-type conductivity, and three electric contact elements 30. Each TE-element 1 has been provided with the same layers defining the ADA/SLID-structure on its first and second surface as shown in more detail in FIG. 3. In FIG. 5, the ADA-structure, i.e. the first adhesion layer 2, the diffusion barrier layer 3 and the second adhesion layer 4, is however illustrated as a single thin layer 40 for the sake of illustrative clarity. On each ADA-structure on both the first 10 and the second 20 side of each TE-element 1, there is deposited a first 5 and a second 6 bonding layer which constitutes the TE-element side of the electric interconnections that are to be formed. The electric contact element which comprises the stratified layered metal structure of a third bonding layer 31 of metal A and a fourth bonding layer 32 of metal B constitutes the electric contact side of the electric interconnections that are to be formed. By pressing these elements 1, 30 together as indicated by the arrows and annealing the entire structure to a temperature where metal B melts and forms one or more solid intermetallic compounds with metal A, the two TE-elements 1 and the three electric contact elements become both electrically connected in series and firmly bonded into a single solid unit by the SLID-bonds formed by the first and second contact layers on the TE-elements and the electric contact elements. Then by adding a first substrate in thermal contact with a heat reservoir and a second substrate in thermal contact with a heat sink onto the outer side (the opposite side of the side facing the TE-elements) of the formed interconnections, a TE-module having a similar structure as shown in i.e. FIG. 2 $a$) or $b$) is formed.

Although not illustrated in FIG. 7, the assembly of the sealing structure of the sealing element and the sealing frames is very similar to the assembly of the electric contact elements and the TE-elements. The sealing element 60 (see FIG. 8) is aligned with and placed between the first and second sealing frame such that the eighth bonding layer 44 of the sealing frame faces and obtains contact with the sixth bonding layer 42 of the sealing element 60 (the figure illustrates the assembly after executing the SLID-bonding such that it is the intermetallic bond 45 that is shown).

The TE-module resulting from the assembly process described above after execution of the SLID-bonding is schematically illustrated in FIG. 8. The figure is a view seem from the side of a vertical cross-section cut along the line A'-A" shown in FIGS. 4 $a$) and 4 $b$). The figure shows the cross-section through two TE-elements 1 of p-type conductivity and two TE-elements 1 of n-type conductivity, each having and ADA-structure 40 (shown as one single layer for illustrative reasons) followed by a first bonding layer 5 of metal A on their first and second sides. In the example embodiment where the sealing element is only provided with a single adhesion layer of Cu, reference 40 in FIG. 8 points to this single adhesion layer. The second bonding layer of both the TE-elements and the corresponding electric contact element has been transformed to an intermetallic face 33 by the SLID-bonding process, which is interposed between the third bonding layer 31 of the corresponding electric contact element and the first bonding layer 5 of the TE-element. The third bonding layer 31 of the electric contact elements is attached onto the surface of the first 50 or the second 51 electrically nonconductive cover substrate. In this manner electric current will be created by the TE-elements when heat is made to flow through the TE-elements by contacting the first 50 and second 51 cover substrates to a heat sink and heat source, respectively. Similarly, as seen on the figure, the sealing element 60 is bonded to a sealing frame on its lover and upper side by a slid bonding formed between the fifth 41, seventh 43 and the sixth 42 bonding layers (the figure illustrates the resulting intermetallic face 45 formed by the SLID-bonding process). The space 70 between the sealing and TE-elements may advantageously be of a dielectric gas with low thermal conductivity such as i.e. nitrogen or argon, or a vacuum, in order to reduce the eventual thermal and electrical leak currents in the thermoelectric module. Alternatively, the space 70 may be filled with a thermally insulating and dielectric material such as i.e. aerogel.

The ADA/SLID-structure provides a very strong and resilient bonding between the electric contact elements and the TE-elements of the TE-device, and is thus especially suited for use in high-temperature appliances which involve relatively strong shear stresses at the bonding interfaces due to differences in the thermal expansions of the materials of the different layers, TE-element and electrode. Even though, the present invention may use any semiconducting thermoelectric conversion material, it is preferred to employ filled or non-filled $CoSb_3$-based skutterudite thermoelectric conversion materials due to their promising figure of merit, ZT, at temperatures up to about 600° C. It is advantageous to employ a metal system with a thermal expansion as equal as the TE-element as possible. Thus, in the case of employing TE-elements of filled or non-filled $CoSb_3$-based skutterudite thermoelectric conversion materials, it is preferred to employ the metal system Ni—Sn for the SLID-bonding.

BRIEF DESCRIPTION OF DRAWINGS

FIG. 2 $b$) is a copy of FIG. 18 of U.S. Pat. No. 6,660,926 (without text on the figure) showing a similar TE-module as shown in FIG. 2 $a$) involving several P-doped and one N-doped elements of thermoelectric conversion materials electrically connected in series.

DESCRIPTION OF THE INVENTION

Example Embodiment of the Invention

Figure 1:
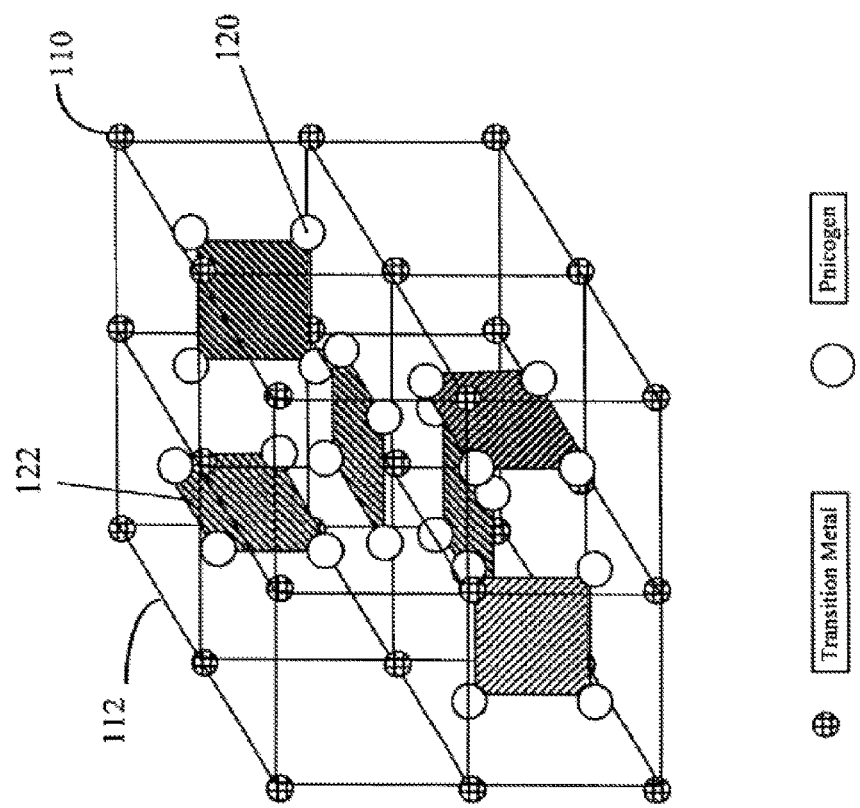
FIG. 1 is a facsimile of FIG. 1 of U.S. Pat. No. 6,660,926 showing a schematic representation of the crystal structure of the mineral skutterudite.
Figure 2:
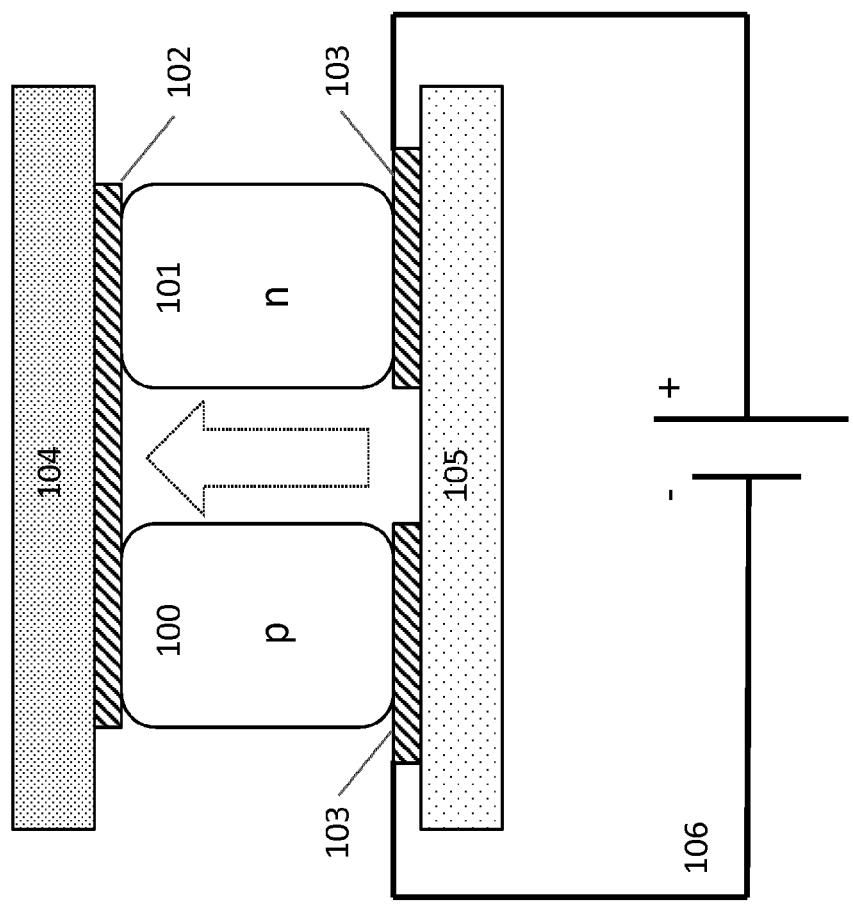
FIG. 2 $a$) is a schematic side view illustrating the structure of a thermoelectric device involving one P-doped and one N-doped element of thermoelectric conversion material.
Figure 2:
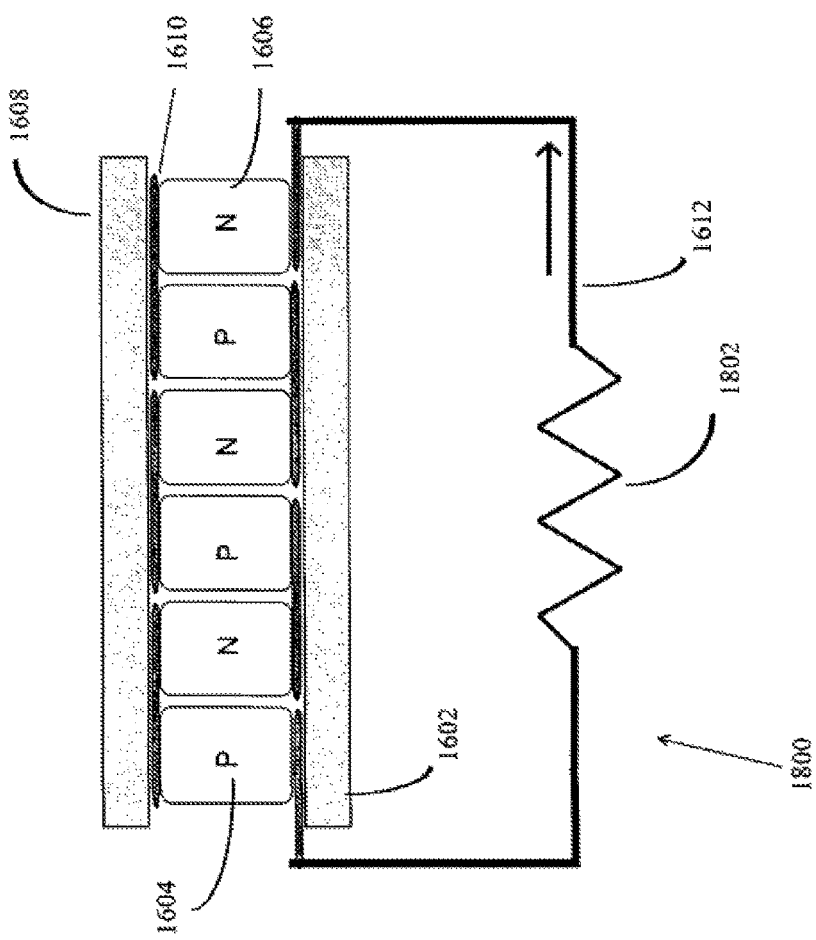
Figure 3:
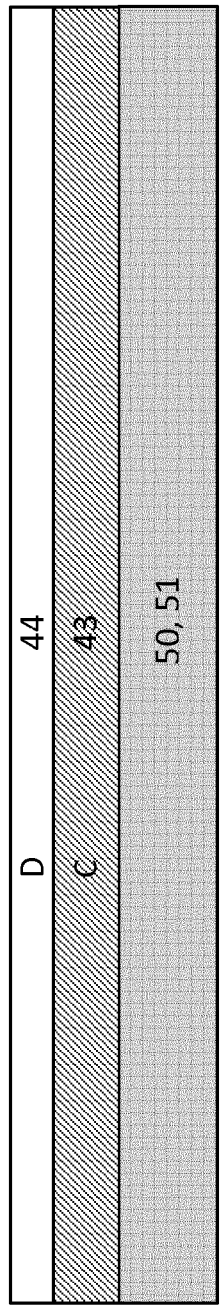
FIGS. 3 $a$) and 3 $b$) is a schematic view of the sealing frame when attached to the cover substrates as seen from the side and from above, respectively.
Figure 4:
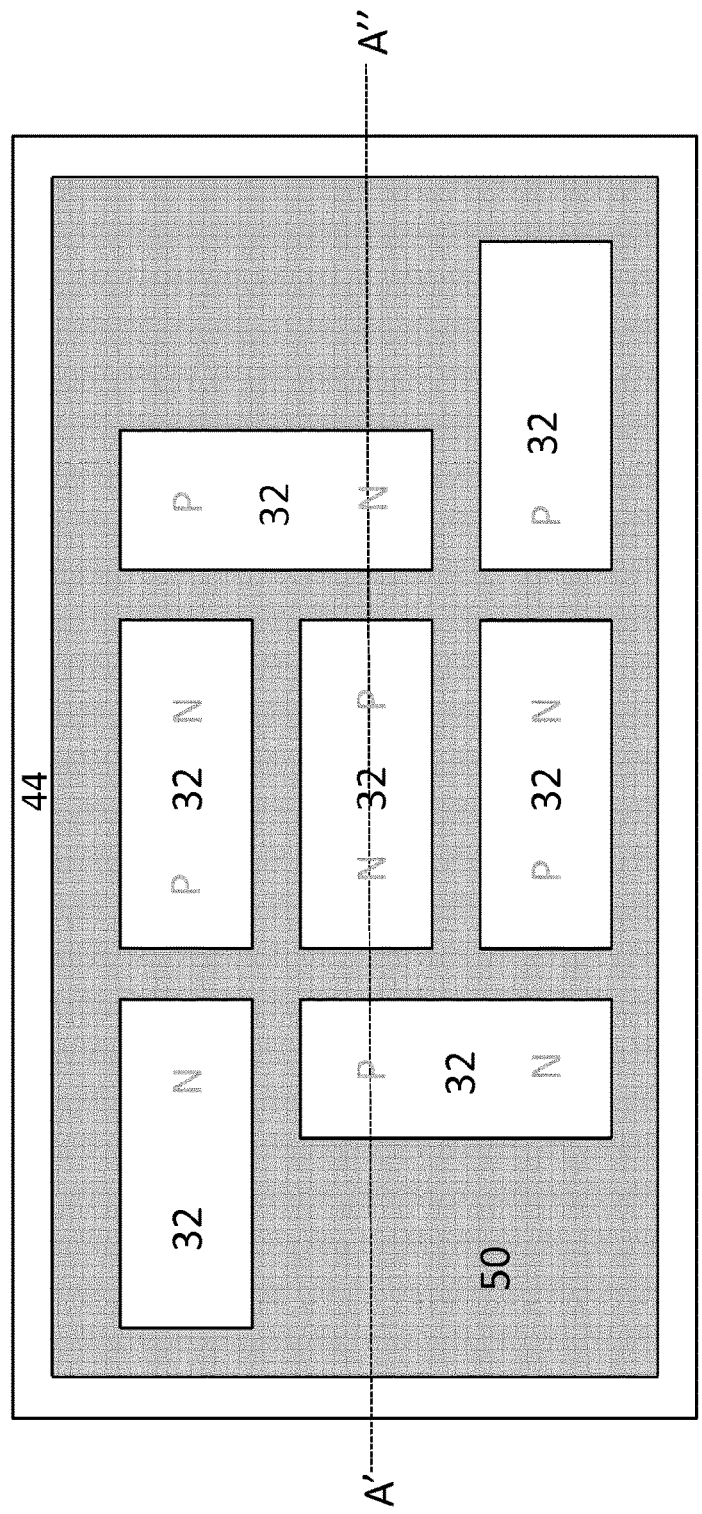
FIG. 4 $a$) and $b$) is a schematic view as seen from above of the first and second cover substrates after deposition and attachment of the sealing frame and the electric contact elements according to one example embodiment.
Figure 4:
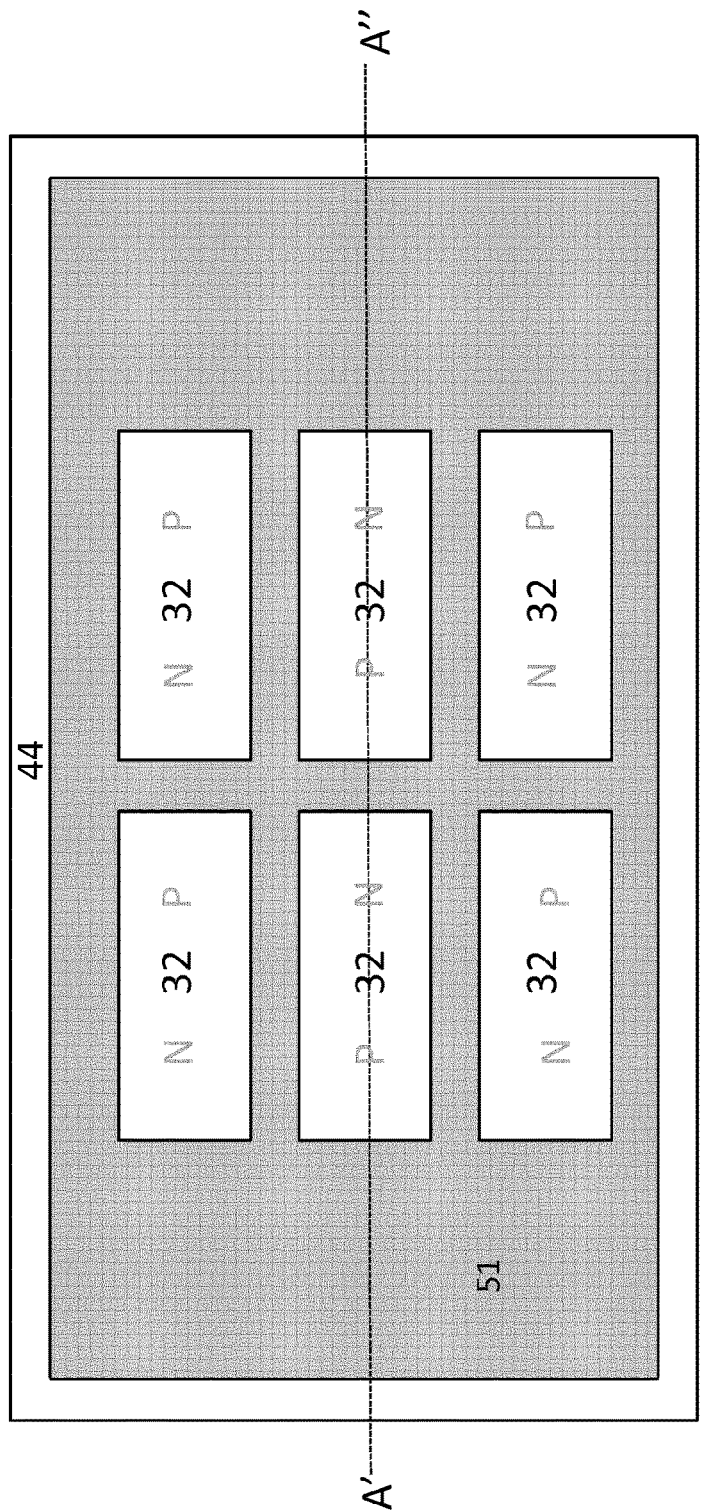
Figure 5:
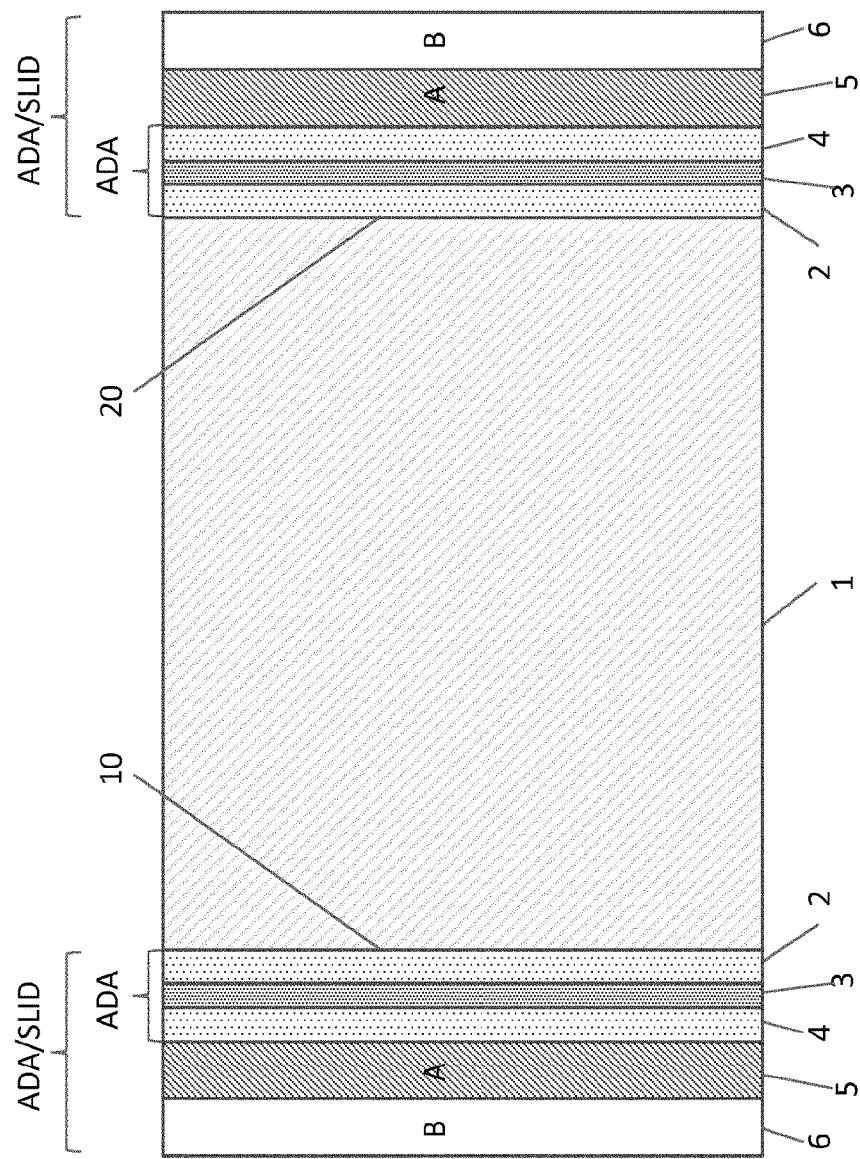
FIG. 5 is a schematic side view illustrating the ADA/SLID-structure on TE-elements employed by the invention.
Figure 6:
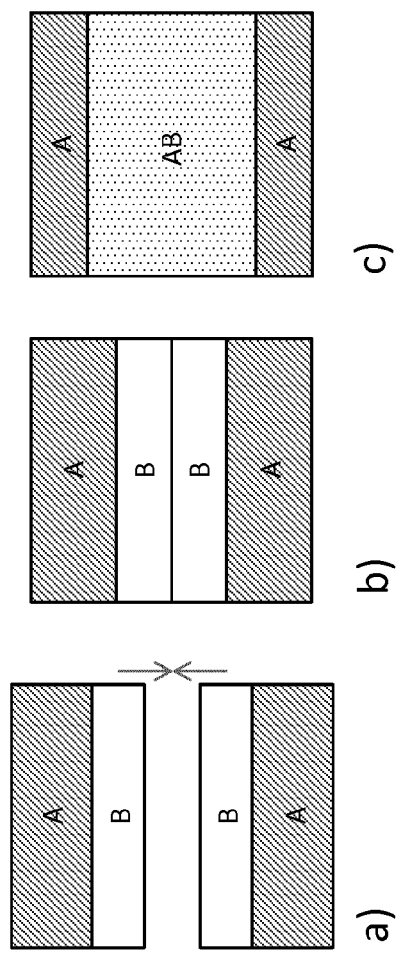
FIGS. 6 $a$) to 6 $c$) are schematic side views illustrating the principle of forming a SLID-bond.
Figure 7:
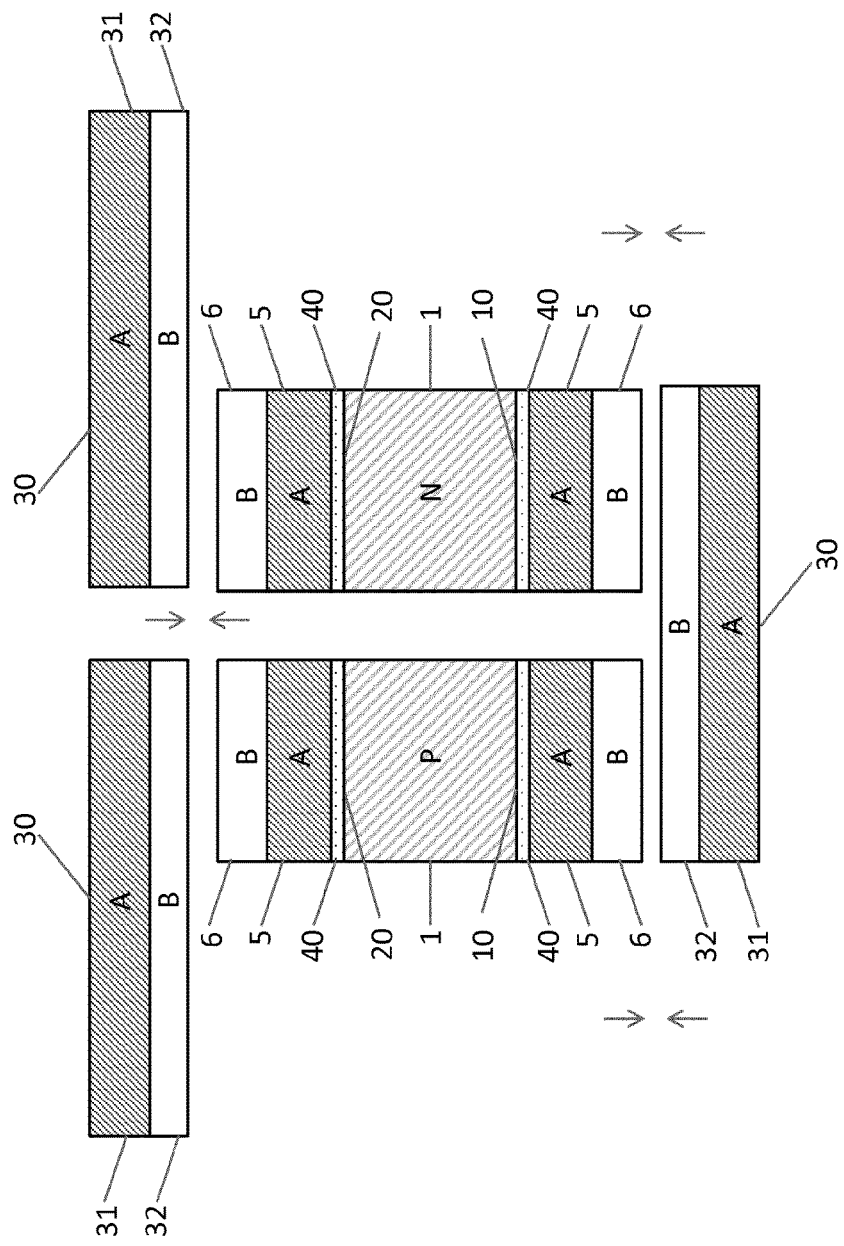
FIG. 7 is a schematic side view illustrating the assembly of one P-doped and on N-doped TE-element having the ADA/SLID-structure according to the invention for interconnecting them is series by SLID-bonding to three electric contact elements.
Figure 8:
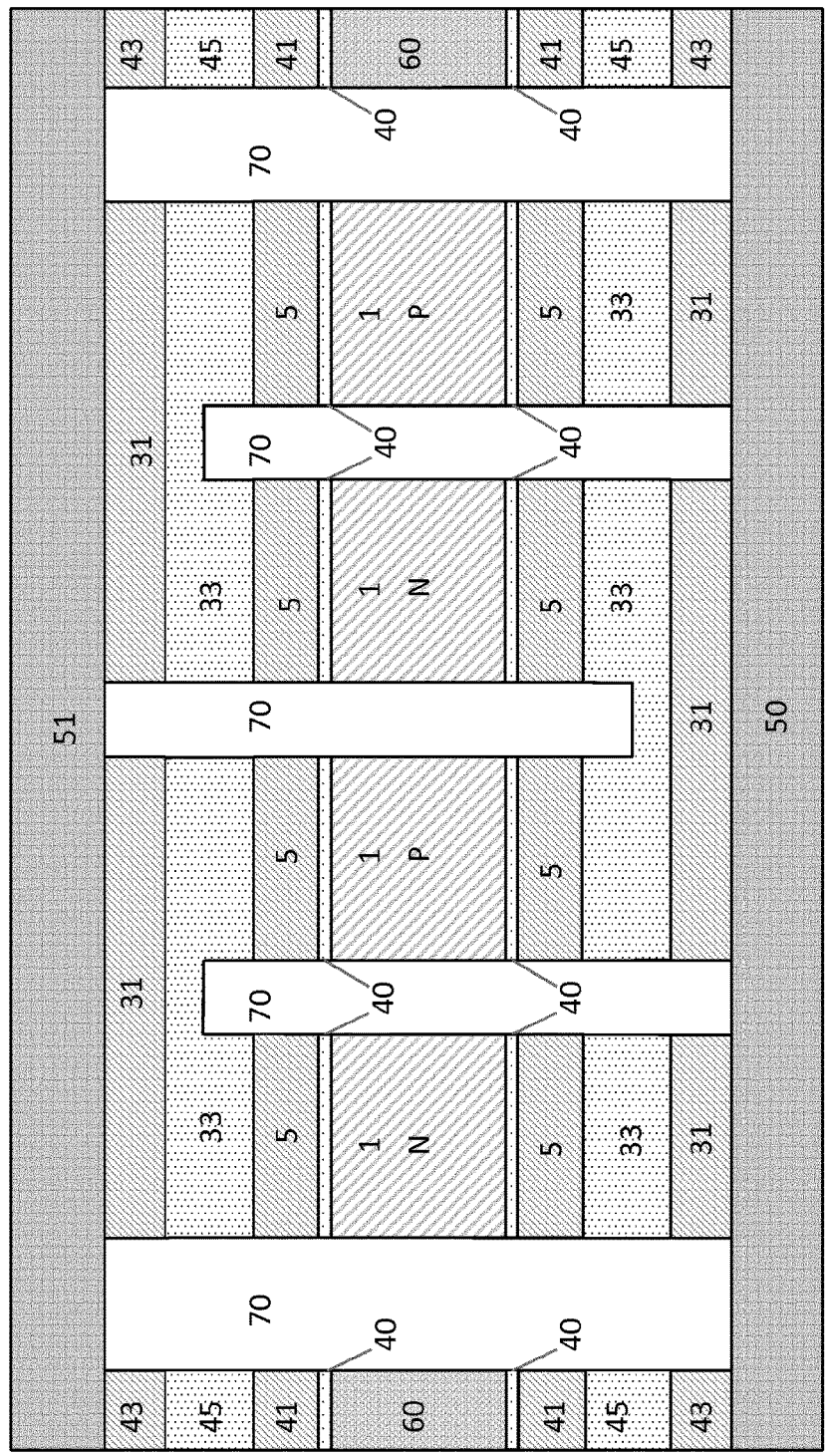
FIG. 8 is a schematic view illustrating of a vertical cross-section cut taken along the line marked A'-A" in FIGS. 4 $a$) and 4 $b$), showing the structure of the TE-module according to the invention after assembly and SLID-bonding.

The invention is described in more detail by way of an example embodiment of a thermoelectric module with a similar construction as illustrated in FIGS. 4 $a$) to 8.

The example embodiment utilizes a filled or non-filled $CoSb_3$-based skutterudite as the semiconducting thermoelectric conversion material intended to operate at high temperatures, i.e. at temperatures in the range from about 0°

C. up to about 800° C. The semiconducting thermoelectric conversion material of the TE-element is thus a filled or non-filled $CoSb_3$-based skutterudite. Each TE-element is provided with the ADA-structure, where the first and second adhesion layer is made of one of Cr, Ta or Ti, and especially preferred of Ti of at least 99.5 weight % pure Ti. The diffusion barrier layer is a nitride of the same metal as employed in the adhesion layers. Thus, the especially preferred ADA-structure comprises a first adhesion layer of Ti of at least 99.5 weight % pure Ti, a diffusion barrier layer of TiN, and a second adhesion layer of Ti of at least 99.5 weight % pure Ti. The first bonding layer of metal A is made of one of; Au, Ag, Cu, Ni, a Ni—V alloy with from 6.5 to 7.5 atomic % V, or a Ni—P alloy with from 5 to 12 weight % P, and metal B is one of; In or Sn.

In an especially preferred embodiment the metal A of the first bonding layer of the TE-element and the third bonding layer of the electric contact element is Ni or Ni—V alloy with from 6.5 to 7.5 atomic % V, and the metal B of the second bonding layer of both the TE-element and the third bonding layer of the electric contact element is Sn. The thicknesses of the layers of the example embodiment may be:

the thickness of the first adhesion layer is in one of the following ranges; from 20 nm to 2 μm, from 50 nm to 1.5 μm, from 100 nm to 1.5 μm, from 200 nm to 1.5 μm, or from 500 nm to 1.5 μm, the thickness of the diffusion barrier layer is in one of the following ranges: from, 50 to 5000 nm, from 75 to 3000 nm, from 100 to 2000 nm, from 150 to 1000 nm, from 150 to 750 nm, from 200 to 500 nm, from 200 to 400 nm or from 200 to 300 nm, the thickness of the second adhesion layer is in one of the following ranges; from 20 nm to 1000 nm, from 30 nm to 750 nm, from 40 nm to 500 nm, from 100 nm to 400 nm, or from 150 nm to 300 nm, the thickness of the first and third bonding layer of metal A is in one of the following ranges; from 1 μm to 1 cm, from 1 μm to 0.5 cm, from 1 μm to 0.1 cm, from 2 μm to 500 μm, from 2 μm to 100 μm, from 2 μm to 50 μm, or from 3 μm to 10 μm, and the thickness of the second and fourth bonding layer of metal B is in one of the following ranges; from 300 nm to 0.75 cm, 300 nm to 0.3 cm, 300 nm to 750 μm, from 200 nm to 400 μm, from 200 nm to 75 μm, from 200 nm to 30 μm, or from 300 nm to 3 μm.

The combination of employing an adhesion layer of pure Ti having a more than 99.5% purity based on the total weight of the Ti-phase, a diffusion barrier layer of TiN and a contact layer of Ni has proven to provide an especially robust metallization exhibiting excellent electric and thermal conductivities of $CoSb_3$-based skutterudite thermoelectric conversion materials, which may easily and securely be bonded to the electrodes of the thermoelectric device by use of the SLID-technology. That is, the electrode may be bonded to the $CoSb_3$-based skutterudite thermoelectric conversion material by depositing a contact layer of Ni and then a bonding layer of Sn on the electrode, and then bonding them together by pressing the bonding layers of Sn together and heating them until the Sn reacts with the Ni and forms one or more of the following intermetallic compounds; $Ni_3Sn$, $Ni_3Sn_2$, or $Ni_3Sn_4$.

The deposition of the ADA-structure and the first and second bonding layers may advantageously be obtained by the following process steps:

employing at least one element of a n-type or p-type doped semiconducting thermoelectric conversion material of a filled or non-filled $CoSb_3$-based skutterudite having a first and second surface on opposite sides, placing the at least one element of semiconducting thermoelectric conversion material into a deposition chamber, and then:

i) depositing a first adhesion layer of a first metal directly onto the first and the second surface of the element of the semiconducting thermoelectric conversion material, ii) depositing a diffusion barrier layer of a non-metallic compound of a second metal directly onto the first adhesion layer on the first and second surface of the semiconducting thermoelectric conversion material element, iii) depositing a second adhesion layer of a third metal directly onto the diffusion barrier layer of the non-metallic compound of the second metal on the first and second surface of the element of the semiconducting thermoelectric conversion material, iv) depositing a first bonding layer of a metal A directly onto the second adhesion layer on the first and second surface of element of the semiconducting thermoelectric conversion material, and v) depositing a second bonding layer of a metal B directly onto the first bonding layer the on the first and second surface of the element of the semiconducting thermoelectric conversion material, wherein the deposition chamber is either a chemical vapor deposition chamber, a physical deposition chamber, or an atomic deposition chamber, and the deposition of the different layers of steps i) to v) is obtained by feeding pre-cursor gases with varying chemical composition into the deposition chamber, the non-metallic compound of the second metal is either a nitride or an oxide of the second metal, and the melting point of metal A is higher than metal B and metal B is chemically reactive towards metal A at their common interface when subject to heating above the melting point of metal B forming an intermetallic compound by solid-liquid interdiffusion.

The sealing element of the example embodiment is a frame made of zirconia equipped with a single adhesion layer instead of the ADA-structure, followed by a first and second bonding layers as described above for the TE-elements of the example embodiment. The deposition of the adhesion layer and the first and second bonding layers may advantageously be obtained simultaneously by the same method as described above for the TE-elements by simply placing the sealing frame in the same deposition chamber.

The inventor has discovered that the bonding strength and the electric and thermal conductivity of the layers forming the metallization structure may be significantly improved by practically avoiding any oxidation of the metal phases (Ti, Ni or Sn) during and after deposition. That is, the deposition process should advantageously be performed in a protected atmosphere practically void of oxygen (i.e. having less than 50 ppm oxygen) or made under a vacuum (i.e. at a pressure of less than 1000 Pa). Alternatively, if the handling of the thermoelectric material after formation of the metallization involves exposure to air/oxygen, the metallic surfaces deposition proves may include depositing 10 to 50 nm of Au on top of the metal layer as an oxidation resistance layer. The oxidation resistance layer may be applied onto either the Ti layer (the adhesion layer), the contact layer (Ni) or the bonding layer (Sn), or one two or more of these.

The pre-processing of the first and second electrically nonconductive cover substrates is obtained by depositing a patterned layer of a metal paste of i.e. Cu onto the first side of the cover substrates, pressing the third bonding layer of each electric contact element that is to be attached to the cover substrates against the deposited metal paste and then annealing at a temperature which sinters the metal paste with the cover substrates and the metal of the third bonding layer of the electric contact elements. In the case of using Cu-paste, the annealing is performed at 600-700° C. in an inert atmosphere of i.e. argon gas. Similarly, the attachment of the sealing frame may be obtained by including the peripheral region of the cover substrates when depositing the patterned layer of metal paste followed by pressing the seventh bonding layer of the sealing frame against the deposited metal paste and then annealing at a temperature which sinters the metal paste with the cover substrate and the metal of the seventh bonding layer of the sealing frame.

The invention claimed is:

1. A thermoelectric module, comprising:
   a number of thermoelectric elements of semiconducting thermoelectric conversion material doped to n-type conductivity and a number of thermoelectric elements of semiconducting thermoelectric conversion material doped to p-type conductivity,
   a number of electric contact elements comprising a third bonding layer of a metal A,
   a sealing system comprising a first sealing frame, a sealing element, and a second sealing frame, wherein the first and second sealing frames each comprise a seventh bonding layer of a metal C, and second bonding layer of a metal D deposited directly onto the first bonding layer and
   a first cover substrate in thermal contact with a heat reservoir and a second cover substrate in thermal contact with a heat sink,
   wherein:
   the thermoelectric elements of n-type conductivity and the thermoelectric elements of p-type conductivity are electrically connected in series by the electric contact elements,
   each electric contact element is, on a first side, bonded to at least one thermoelectric element, and on a second side opposite the first side, bonded to one of the first and second cover substrates,
   each thermoelectric element of n-type conductivity and each thermoelectric element of p-type conductivity has a first surface and an opposing second surface and has on both of the first and second surfaces:
   i) a first adhesion layer of a first metal deposited directly onto the first and second surfaces,
   ii) a diffusion barrier layer of a non-metallic compound of a second metal deposited directly onto the first adhesion layer on the first and second surfaces,
   iii) a second adhesion layer of a third metal deposited directly onto the diffusion barrier layer of the non-metallic compound of the second metal on the first and second surfaces,
   iv) a first bonding layer of a metal A deposited directly onto the second adhesion layer on the first and second surfaces, and
   v) a second bonding layer of a metal B deposited directly onto the first bonding layer of metal A on the first and second surfaces, and
   the sealing element has, on a first side and a second side opposite the first side:
   vi) an adhesion layer of Cu,
   vii) a fifth bonding layer of a metal C deposited directly onto the adhesion layer on the first and second sides, and
   viii) a sixth bonding layer of a metal D deposited on the fifth bonding layer,
   the first sealing frame is at a first side of the seventh bonding layer of metal C attached to the first cover substrate and on a side opposite the first side bonded to the sealing element by solid-liquid interdiffusion bonding, and
   the second sealing frame is at a first side of the seventh bonding layer of metal C attached to the second cover substrate and on a side opposite the first side bonded to the sealing element by solid-liquid interdiffusion bonding, and where
   the non-metallic compound of the second metal is either a nitride or an oxide of the second metal,
   the melting point of metal A is higher than the melting point of metal B and the melting point of metal C is higher than the melting point of metal D, and metals A and B and metals C and D are chemically reactive towards each other and form one or more intermetallic compounds by solid-liquid interdiffusion when subject to heating above the melting point of metal B and the melting point of metal D, and
   the solid-liquid interdiffusion bonds between the thermoelectric elements and the electric contact elements are formed by laying the second bonding layer of metal B of the thermoelectric elements facing and contacting the third bonding layer of metal A of the electric contact elements followed by an annealing which causes metal B of the second bonding layer to melt and react with metal A of the first bonding layer of the thermoelectric elements and with metal A of the third bonding layer of the electric contact elements, and
   the solid-liquid interdiffusion bonds between the sealing element and each of the first and second sealing frames are formed by laying the sixth bonding layer of metal D of the sealing element facing and contacting the seventh bonding layer of metal C of each of the first and second sealing frames followed by an annealing which causes metal D of the sixth bonding layer to melt and react with metal C of the fifth bonding layer of the sealing element and with metal C of the seventh bonding layer of each of the first and second sealing frames.

2. The thermoelectric module according to claim 1, wherein the semiconducting thermoelectric conversion material is a filled or non-filled $CoSb_3$-based skutterudite.

3. The thermoelectric module according to claim 1, wherein the first metal of the first adhesion layer and the third metal of the second adhesion layer are of the same elementary metal, and wherein the non-metallic compound of the second metal of the diffusion barrier layer is a nitride or an oxide of the same elementary metal as the first and third metals.

4. The thermoelectric module according to claim 3, wherein the elementary metal of the first metal of the first adhesion layer and the third metal of the second adhesion layer is one of Cr, Cu, Sn, Ta, and Ti.

5. The thermoelectric module according to claim 1, wherein metal A of the first bonding layer or metal A of the third bonding layer is one of the following elementary metals; Au, Ag, Cu, Ni, or Ni—V alloy with from 6.5 to 7.5 atom % V, and metal B of the second bonding layer is one of the following elementary metals: In or Sn.

6. The thermoelectric module according to claim 1, wherein the first and second metals are Ti of at least 99.5 weight % purity, the non-metallic compound of the second metal of the diffusion barrier layer is TiN, metal A of the first bonding layer is Ni, metal A of the third bonding layer is Ni, and metal B of the second bonding layer is Sn.

7. The thermoelectric module according to claim 1, wherein: the thickness of the first adhesion layer is in the range from 20 nm to 2 microns; the thickness of the diffusion barrier layer is in the range from 50 nm to 5000 nm; the thickness of the second adhesion layer is in the range from 20 nm to 1000 nm; the thickness of the first bonding layer of metal A is in the range from 1 micron to 1 cm; and the thickness of the second bonding layer of metal B is in the range from 300 nm to 0.75 cm.

8. The thermoelectric module according to claim 1, wherein:
- the sealing element is made of either zirconia or aluminum titanate, and
- metal C is the same as metal A, and metal D is the same as metal B.

9. The thermoelectric module according to claim 1, wherein the electric contact elements further comprise a fourth bonding layer of metal B.

10. The thermoelectric module according to claim 1, wherein the first and second sealing frames each further comprise an eighth bonding layer of metal D.

* * * * *